United States Patent
Gorla et al.

(10) Patent No.: US 8,026,515 B1
(45) Date of Patent: Sep. 27, 2011

(54) PLATFORM-INDEPENDENT SYSTEM AND METHOD FOR CONTROLLING A TEMPERATURE OF AN INTEGRATED CIRCUIT

(75) Inventors: Gabriele Gorla, Santa Clara, CA (US);
Sau Yan Keith Li, San Jose, CA (US);
Arlen J. Cox, Loveland, CO (US)

(73) Assignee: NVIDIA Corporation, Santa Clara, CA (US)

( * ) Notice: Subject to any disclaimer, the term of this patent is extended or adjusted under 35 U.S.C. 154(b) by 225 days.

(21) Appl. No.: 11/535,931

(22) Filed: Sep. 27, 2006

(51) Int. Cl.
*H01L 29/10* (2006.01)

(52) U.S. Cl. ........................ 257/48; 257/E23.179; 438/5

(58) Field of Classification Search ........ 438/5; 257/48, 257/E23.179
See application file for complete search history.

(56) References Cited

U.S. PATENT DOCUMENTS

| | | | |
|---|---|---|---|
| 2003/0141860 A1* | 7/2003 | Chi et al. ................ | 324/158.1 |
| 2005/0206368 A1* | 9/2005 | Lopez et al. ............. | 324/158.1 |
| 2006/0006646 A1* | 1/2006 | Rich et al. ............... | 285/288.1 |
| 2006/0064265 A1* | 3/2006 | Kiryu ....................... | 702/117 |

* cited by examiner

*Primary Examiner* — Matthew Smith
*Assistant Examiner* — Elias Ullah
(74) *Attorney, Agent, or Firm* — Zilka-Kotab, PC

(57) ABSTRACT

A platform-independent temperature controller system and method are provided. Included is a sensor is in communication with an integrated circuit. Further, a platform-independent temperature controller is in communication, with the sensor for controlling a temperature of the integrated circuit.

22 Claims, 4 Drawing Sheets

PLATFORM-INDEPENDENT SYSTEM AND METHOD FOR CONTROLLING A TEMPERATURE OF AN INTEGRATED CIRCUIT

FIELD OF THE INVENTION

The present invention relates to integrated circuits, and more particularly to heating integrated circuits for testing purposes.

BACKGROUND

Traditionally, various heaters have been utilized to increase the temperature of integrated circuits for various testing purposes. One example of such heaters includes a conventional oven. In use, an integrated circuit is typically placed within such an oven and heated, after which the integrated circuit is tested.

Unfortunately, such ovens are often limited in terms of the range of temperatures in which they are capable of heating. Further, the temperature of the oven does not necessarily translate to the temperature of the integrated circuit. For example, the temperature of the integrated circuit may be cooler than that of the oven, etc. Still yet, the oven may only be used to heat the integrated circuit prior to the aforementioned testing. Thus, during such testing, the integrated circuit may cool when exposed to an environmental temperature, etc.

Various temperature controllers have been produced to overcome the problems of conventional heaters. However, such temperature controllers have been unfortunately limited, to platform-specific designs, thus limiting the usability thereof.

There is thus a need for overcoming these and/or other problems associated with the prior art.

SUMMARY

A platform-independent temperature controller system and method are provided. Included is a sensor is in communication with an integrated circuit. Further, a platform-independent temperature controller is in communication with the sensor for controlling a temperature of the integrated circuit.

BRIEF DESCRIPTION THE DRAWINGS

DETAILED DESCRIPTION

Figure 1:
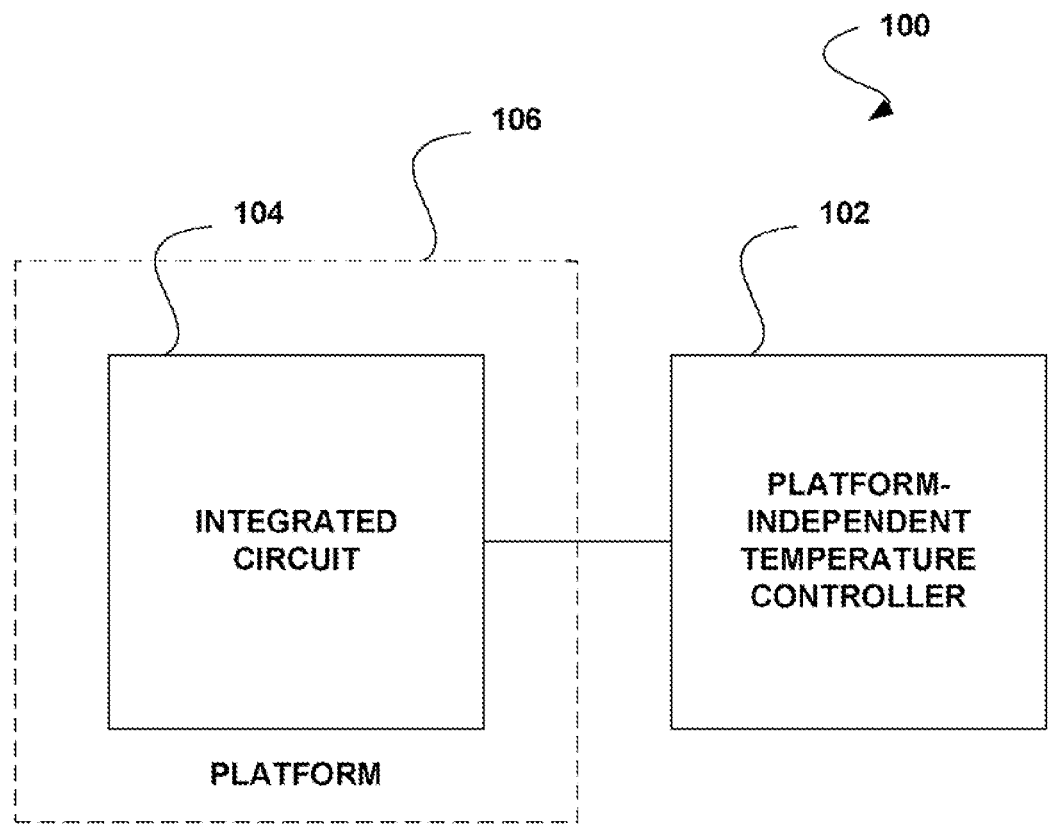
FIG. 1 shows a system for controlling a temperature of an integrated circuit utilizing a temperature controller, in accordance with one embodiment.

FIG. 1 shows a system 100 for controlling a temperature of an integrated circuit utilizing a temperature controller, in accordance with one embodiment. As shown, an integrated circuit 104 is included. The integrated circuit 104 may include, for example, a central processing unit (CPU), a graphics processor, a media and communications processor (MCP), and/or any other integrated circuit, for that matter.

In addition, a platform 106 may be provided. Thus, as shown, the integrated circuit 104 may optionally be included on the platform 106. In one embodiment, the platform 106 may include a board (e.g. motherboard, expansion board, etc.) on which the integrated circuit 104 may be mounted.

In another embodiment, the platform 106 may refer to non-mechanical aspects of the integrated circuit 104. For instance, the platform 106 may include an operating system associated with the integrated circuit 104. Of course, however, the platform 106 may include any desired environment, characteristic, and/or accompanying architecture/functionality associated with the integrated circuit 104.

Moreover, a platform-independent temperature controller 102 is provided which is in communication with the integrated circuit 104, as shown. The platform-independent temperature controller 102 may include anything that is platform-independent and capable of controlling a temperature of the integrated circuit 104. In one embodiment, the platform-independent temperature controller 102 may include a circuit specifically tailored for controlling the temperature of the integrated circuit 104.

In various other embodiments, the platform-independent temperature controller 102 may increase/decrease the temperature of the integrated circuit 104. In the context of one embodiment, the platform-independent temperature controller 102 may optionally be in communication with a heater and/or cooler for accomplishing this. Thus, the platform-independent temperature controller 102 may command the heater and/or cooler to heat and/or cool the integrated circuit 104. More information regarding examples of such heaters and/or coolers will be described in more detail in the context of different embodiments during reference to FIG. 2. It should be noted, however, that the platform-independent temperature controller 102 may control the temperature of the integrated circuit 104 in any desired manner.

Further, as shown, the platform-independent temperature controller 102 may be separate from the platform 106 and/or the integrated circuit 104. In one optional embodiment, the platform-independent temperature controller 102 may even be removable therefrom (e.g. removably connected, etc.). Thus, the platform-independent temperature controller 102 may be capable of being utilized in conjunction with a plurality of integrated circuits.

Still yet, the platform-independent temperature controller 102 may be capable of being utilized with a plurality of different platforms. As a result, the temperature of a plurality of different integrated circuits may be controlled by the platform-independent temperature controller 102. In this way, the platform-independent temperature controller 102 may be used to control the temperatures of such different integrated circuits, despite the various differences in the platforms thereof.

More illustrative information will now be set forth regarding various optional architectures and functionality of different embodiments with which the foregoing system 100 may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
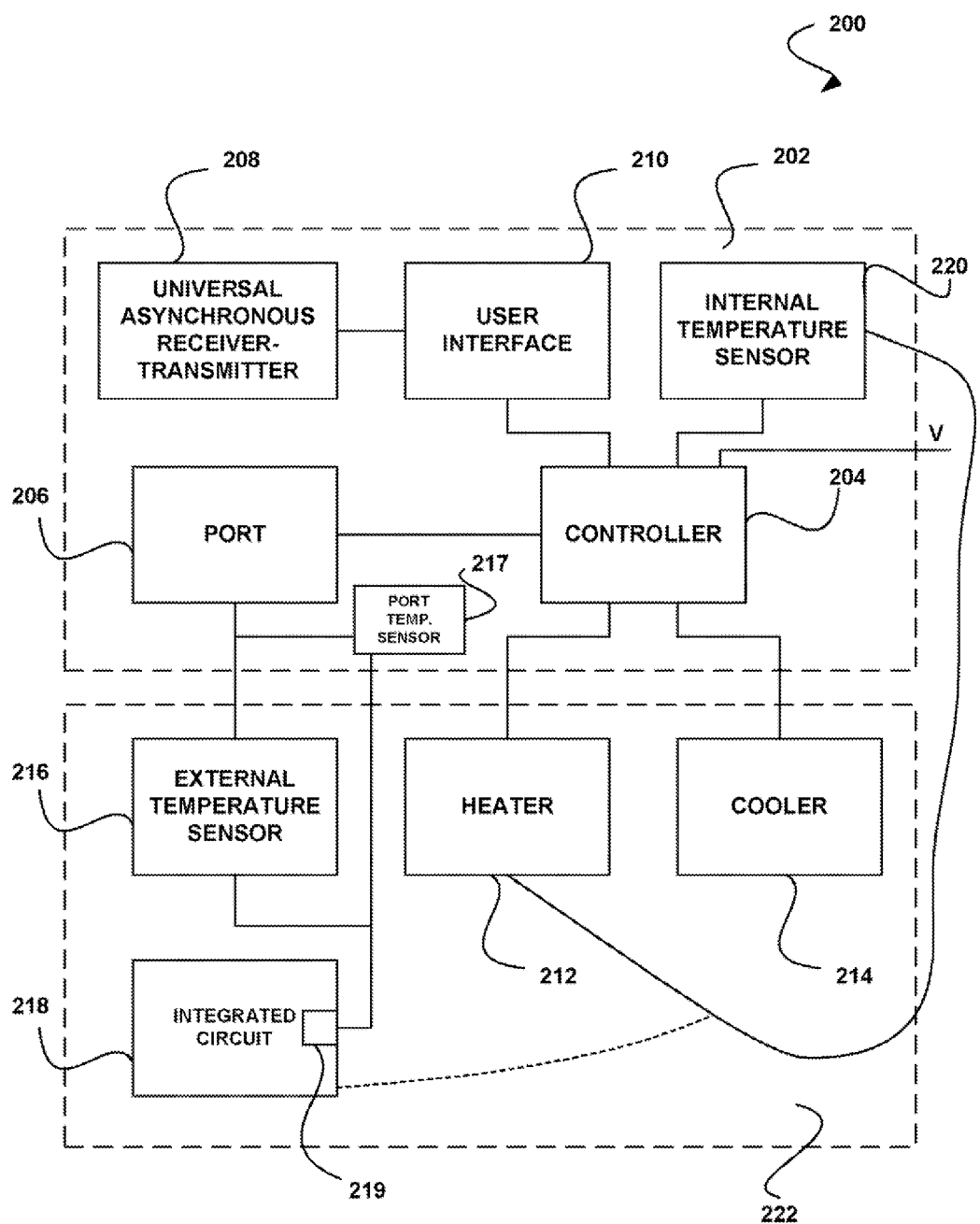
FIG. 2 shows a platform-independent temperature controller system for controlling a temperature of an integrated circuit, in accordance with another embodiment.

FIG. 2 shows a system 200 for controlling a temperature of an integrated circuit utilizing a platform-independent temperature controller, in accordance with another embodiment. As an option, the system 200 may be implemented in the context of the details of FIG. 1. Of course, however, the system 200 may be used in any desired environment. Further, the aforementioned definitions may equally apply to the description below.

As shown, a first board 202 may be provided which includes a controller 204. In the context of the present embodiment, the controller 204 may include a temperature controller which serves to control the temperature of an integrated circuit 218. Further, the controller 204 may be platform-independent, and even be capable of controlling the temperature of a plurality of different types of integrated circuits. Of course, it should be noted, however, that the controller 204 may also be capable of controlling other components, for facilitating such purpose.

The first board 202 may additionally include a user interface 210. As shown, the user interface 210 may be connected to the controller 204, such that the controller 204 may receive input from a user utilizing the user interface 210. In various embodiments, the user interface 210 may allow the user to control the temperature of the integrated circuit 218.

In one embodiment, the user interface 210 may include a display (e.g. liquid crystal display, etc.). Just by way of example, the user interface 210 may allow the user to view a current temperature of the integrated circuit 218 via the display. The user interface 210 may also allow the user to view a target temperature (e.g. desired temperature, etc.) of the integrated circuit 218 via the display.

In another embodiment, the user interface 210 may also include at least one input device (e.g. numeric keypad, toggle, simple buttons, etc.). Thus, the user interface 210 may allow the user to select a target temperature (e.g. desired temperature, etc.) of the integrated circuit 218 via the input device. To this end, the user may have control over the temperature of the integrated circuit 218.

Still yet, the input device may also allow a user to input a start time, stop time, and/or length of time associated with the target temperature. For example, such times may specify a period, duration, etc. during which the integrated circuit 218 is to remain at the target temperature, etc. Of course, the input device may also allow the user to immediately start and/or stop heating and/or cooling of with the integrated circuit 218.

Moreover, the first board 202 may include a universal asynchronous receiver-transmitter (UART) 208. The UART 208 may include an interface, such that an external device may provide input, such as the user input described above, to the controller 204. Further, the UART 208 may be capable of communicating (e.g. receiving/transmitting information, commands, etc.) with any desired type of device, for any desired purpose.

In one embodiment, the first board 202 may additionally include an internal temperature sensor 220. Thus, the controller 204 may receive temperature information from the internal temperature sensor 220. In use, the internal temperature sensor may be placed in mechanical communication with the appropriate components of the board 222 (e.g. by a user, etc.).

For example, the internal temperature sensor 220 may be placed in contact with the integrated circuit 218, a heater 212, etc. such that the internal temperature sensor 220 may sense the temperature of the integrated circuit 218. Optionally, the internal temperature sensor 220 may be placed in contact with the appropriate component(s) utilizing a thermocouple and an associated wire, in the manner shown. Of course, the internal temperature sensor 220 may include any type of sensor capable of sensing a temperature of the integrated circuit 218.

The first board 202 may power the controller 204, user interface 210, UART 208 and/or any other component by way of a voltage received from an external power source, as shown. The external power source may include a power supply, for example. Thus, the first board 202 may optionally function without necessarily requiring the use of a computer or other device, if desired.

Further, the first board 202 may include at least one port 206. The port 206 may be utilized for providing communication between the first board 202 and an external second board 222. In one embodiment, the external second board 222 may include the integrated circuit 218 for which temperature is being controlled.

As shown, the external second board 222 may additionally include an external temperature sensor 216 in communication with the integrated circuit 218. As an option, the external temperature sensor 216 may remain in communication with the controller 204 via the port 206 of the first board 202. In various embodiments, such port 206 may include an Inter-integrated circuit (I2C) interface, serial peripheral interface (SPI) interface, and/or any other desired interface for providing the aforementioned communication. Thus, as shown, the external temperature sensor 216 may be external to (e.g. separate from, etc.) the first board 202 and therefore external to the controller 204, as well.

While not necessarily shown in FIG. 2, the external temperature sensor 216 may remain in mechanical and/or electrical communication with the integrated circuit 218. Further, the external temperature sensor 216 may include any type of sensor capable of sensing a temperature of the integrated circuit 218. Just by way of example, an integrated diode 219 may reside on the integrated circuit 218 itself.

In use, the temperature of the integrated circuit 218 may be calculated by monitoring a current associated with the integrated diode 219. Specifically, the external temperature sensor 216 may receive the current associated with the integrated diode 219 of the integrated circuit 218. In addition, the external temperature sensor 216 may convert such current to a temperature which, in turn, is communicated to the controller 204 via the port 206.

In another embodiment (for example, where the external temperature sensor 216 is absent, etc.), a port temperature sensor 217 may receive the current directly from the integrated diode 219 of the integrated circuit 218 (as shown). As shown, the port temperature sensor 217 may remain in communication with the integrated diode 219, via the port 206 of the first board 202. In this way, the port temperature sensor 217 may be capable of converting the current to a temperature associated therewith and communicating the same to the controller 204.

Still yet, a heater 212 may be included on the external second board 222. The heater 212 may include, for example, a heater block, a peltier, and/or any other heater capable of increasing the temperature of the integrated circuit 218. The heater 212 may be in communication with the controller 204, such that the controller 204 may activate and/or adjust a temperature of the heater 212.

For example, controller 204 may activate and/or adjust a temperature of the heater 212 based on temperature information and/or user input received by the controller 204. Further, while not necessarily shown, the heater 212 may be in contact with the integrated circuit 218 for increasing the temperature thereof accordingly. Thus, the heater 212 may be utilized for increasing a temperature of the integrated circuit 218.

Additionally, a cooler 214 may be included on the external second board 222. The cooler 214 may include, for example, a fan, a liquid-based cooling system, and/or any other cooler capable of decreasing the temperature of the integrated circuit 218. Further, the cooler 214 may be in communication with the controller 204, such that the controller 204 may activate and/or adjust a temperature of the cooler 214.

For example, the controller 204 may activate and/or adjust a temperature of the cooler 214 based on temperature information and/or user input received by the controller 204. In addition, while not necessarily shown, the cooler 214 may be in contact with the integrated circuit 218 for decreasing the temperature thereof accordingly. Thus, the cooler 214 may be utilized for decreasing a temperature of the integrated circuit 218.

As mentioned previously, it should be noted that any of the components described above with respect to the external second board 222 may be in communication with each other (e.g. may be in contact with each other, etc.). Consequently, temperature information and/or input received by the controller 204 may be utilized by the controller 204 for controlling the temperature of the integrated circuit 218. In this way, the first board 202 may be utilized with respect to a plurality of different integrated circuits, since the controller 204 may receive data from any desired type of integrated circuit implemented on any type of board, etc. utilizing the techniques described herein.

Figure 3:
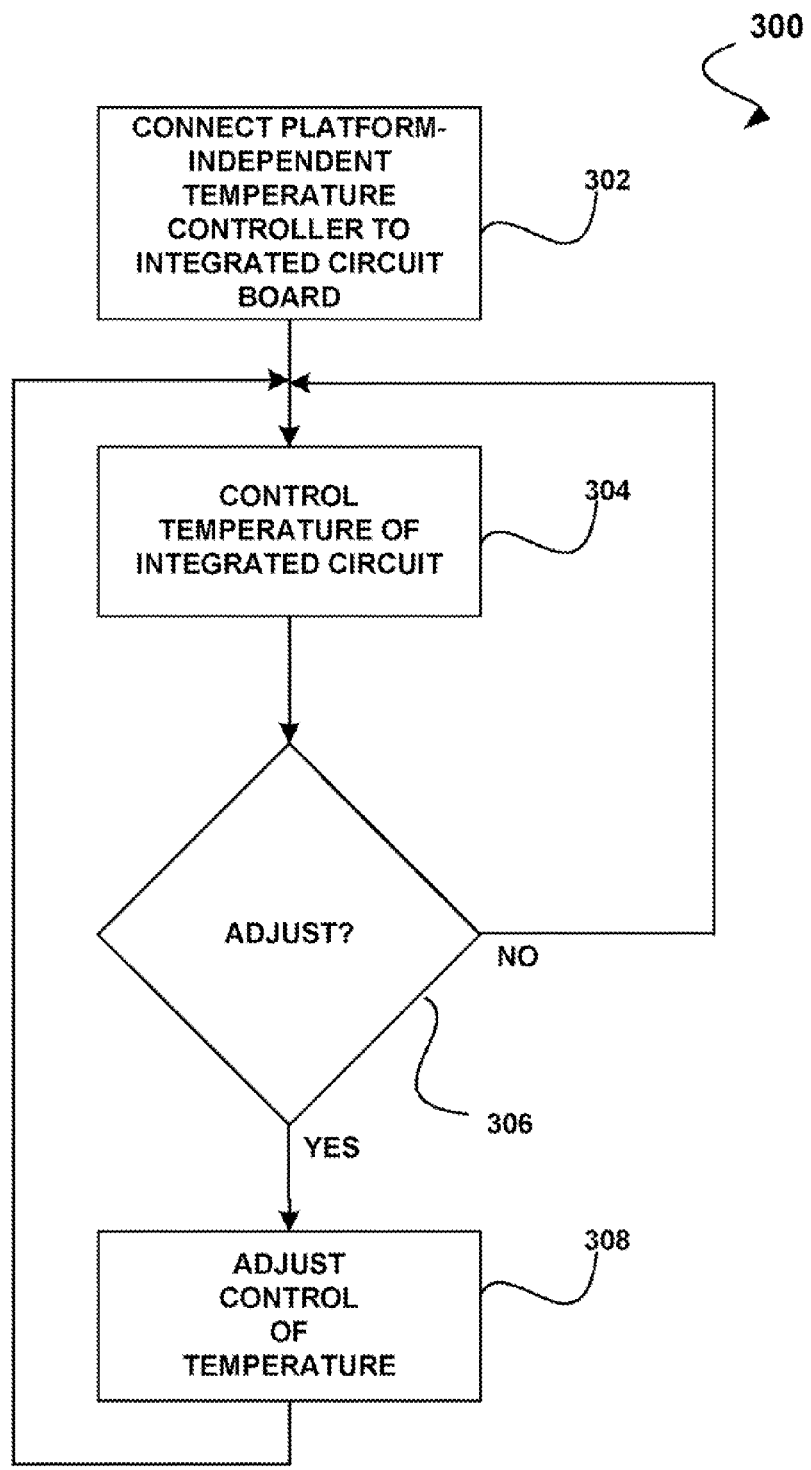
FIG. 3 illustrates a method for adjusting control of a temperature of an integrated circuit, in accordance with yet another embodiment.

FIG. 3 illustrates a method 300 for adjusting control of a temperature of an integrated circuit, in accordance with yet another embodiment. As an option, the method 300 may be implemented in the context of the details of FIGS. 1 and/or 2. Of course, however, the method 300 may be used in any desired environment. Again, the aforementioned definitions may equally apply to the description below.

As shown in operation 302, a temperature controller (e.g. the controller 204 of FIG. 2, etc.) is connected to an integrated circuit board (e.g. the second board 222 of FIG. 2, etc.). The temperature controller may be connected to the integrated circuit board utilizing a port (e.g. the port 206 of FIG. 2, etc.), for example.

Once connected, the temperature controller controls the temperature of an integrated circuit on the integrated circuit board, as shown in operation 304. The temperature controller may control the temperature of the integrated circuit in any desired manner. For example, the temperature controller may control a heater and/or cooler associated with the integrated circuit. In this way, the temperature controller may maintain the temperature of the integrated circuit.

It is then determined whether the temperature controller is to adjust the temperature of the integrated circuit, as shown in decision 306. In one embodiment, such decision 306 may be based on input received via a user interface (e.g. the user interface 210 of FIG. 2, etc.) and/or a UART (e.g. the UART 208 of FIG. 2, etc.). For example, the input may include a command to increase the temperature of the integrated circuit to a first desired temperature or to decrease the temperature of the integrated circuit to a second desired temperature.

in another embodiment, the decision 306 may be based on temperature information received from the integrated circuit. For example, a sensor associated with the integrated circuit may sense a temperature associated with the integrated circuit and transmit temperature information to the temperature controller. Of course, however, the temperature information may also be received by the temperature controller directly from the integrated circuit, in other embodiments.

For example, the temperature controller may determine whether the temperature information matches a desired temperature (e.g. the most recent input received, etc.) associated with the integrated circuit. If there is a match, the temperature controller continues to control the temperature of the integrated circuit (see operation 304).

If there is not a match, it may be determined in decision 306 that the temperature of the integrated circuit is to be adjusted to meet such target temperature. If it is determined that the temperature of the integrated circuit is to be adjusted, control of the temperature may be adjusted by the temperature controller, as shown in operation 308. In particular, the temperature may be adjusted utilizing the heater and/or cooler, as described above. In this way, the temperature controller may increase and/or decrease a temperature of the integrated circuit.

In one optional embodiment, the temperature controller may control the temperature of the integrated circuit for testing purposes. Thus, the temperature controller may accurately increase and/or decrease the temperature of the integrated circuit by determining the actual temperature of the integrated circuit. Moreover, the temperature controller may maintain the temperature of the integrated circuit, therefore allowing testing to be performed for any period of time at a constant temperature. In this way, accurate testing results based on a temperature of the integrated circuit may be achieved.

Figure 4:
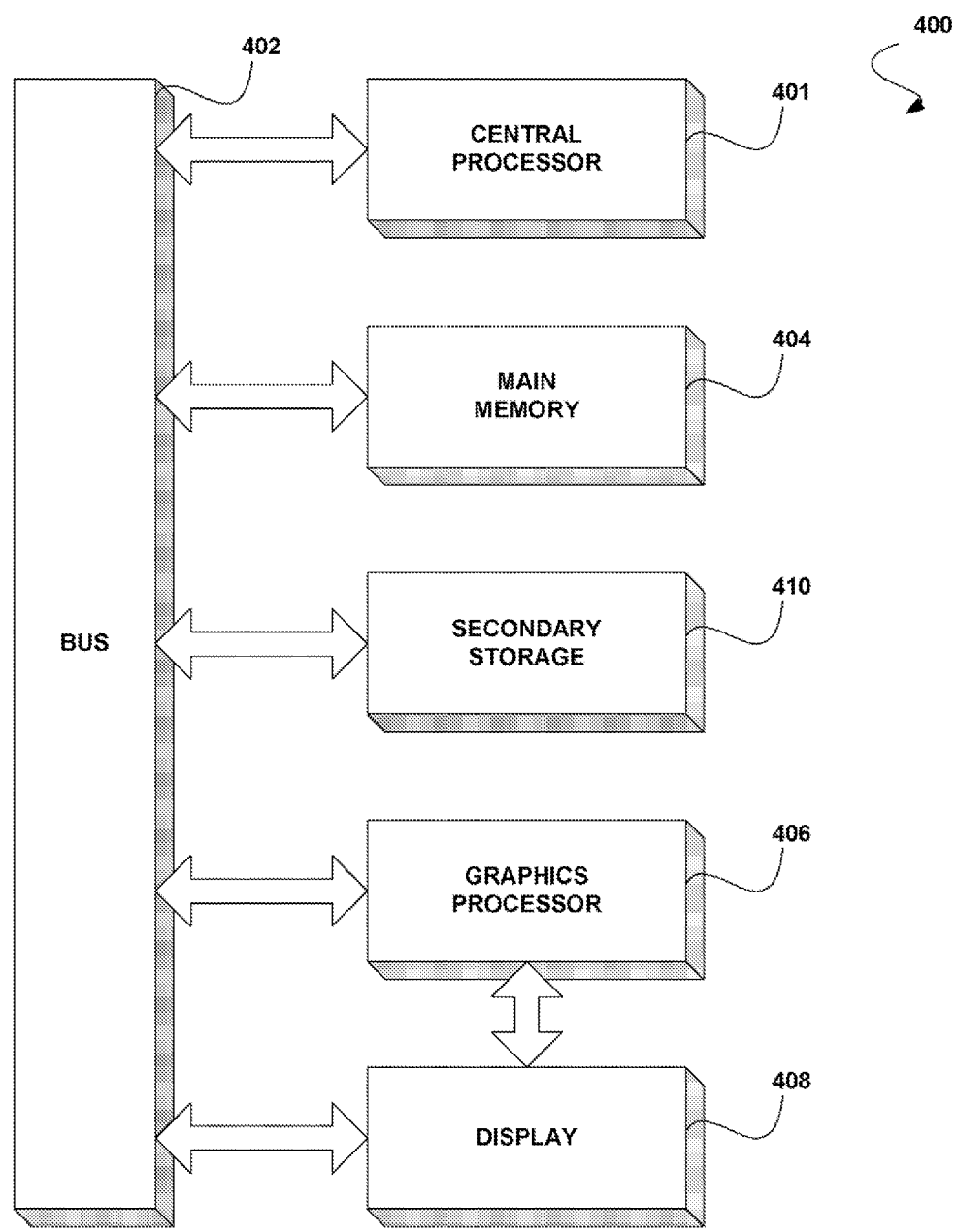
FIG. 4 illustrates an exemplary system, in accordance with one embodiment.

FIG. 4 illustrates an exemplary system 400, in accordance with one embodiment. As an option, the system 400 may be implemented in the context of any of the details of FIGS. 1-3. For example, any of the components of the system 400 may be the subject of the aforementioned heating, cooling, etc. Of course, the system 400 may be implemented in any desired environment.

As shown, a system 400 is provided including at least one central processor 401 which is connected to a communication bus 402. The system 400 also includes main memory 404 [e.g. random access memory (RAM), etc.]. The system 400 also includes a graphics processor 406 and a display 408. A temperature of the central processor 401 and/or the graphics processor 406 may be controlled, as described above with respect to any of FIGS. 1-3.

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

While various embodiments have e been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
   a sensor in communication with an integrated circuit; and
   a platform-independent temperature controller in communication with the sensor for controlling a temperature of the integrated circuit;
   wherein the platform-independent temperature controller controls the temperature of a plurality of different types of integrated circuits;
   wherein a port temperature sensor receives current directly from an integrated diode of the integrated circuit, remains in communication with the integrated diode via a port coupled to the platform-independent temperature controller, converts the current to a temperature associated with the integrated circuit, and communicates the temperature to the platform-independent temperature controller.

2. The apparatus as recited in claim 1, wherein the sensor is in mechanical communication with the integrated circuit.

3. The apparatus as recited in claim 1, wherein the sensor is in electrical communication with the integrated circuit.

4. The apparatus as recited in claim 1, and further comprising a heater in communication with the platform-independent temperature controller for increasing the temperature of the integrated circuit.

5. The apparatus as recited in claim 4, wherein the heater includes a heater block.

6. The apparatus as recited in claim 4, wherein the heater includes a peltier.

7. The apparatus as recited in claim 1, and further comprising a cooler in communication with the platform-independent temperature controller for decreasing the temperature of the integrated circuit.

8. The apparatus as recited in claim 7, wherein the cooler includes a fan.

9. The apparatus as recited in claim 7, wherein the cooler includes a liquid-based cooling system.

10. The apparatus as recited in claim 1, wherein the sensor includes an external sensor external to a board on which the platform-independent temperature controller resides.

11. The apparatus as recited in claim 10, wherein the external sensor resides on a board on which the integrated circuit resides.

12. The apparatus as recited in claim 10, wherein the external sensor resides on the integrated circuit.

13. The apparatus as recited in claim 12, wherein the external sensor includes a diode.

14. The apparatus as recited in claim 10, wherein the platform-independent temperature controller remains in communication with the external sensor via the port on the board on which the platform-independent temperature controller resides.

15. The apparatus as recited in claim 1, wherein the sensor resides on a board on which the platform-independent temperature controller resides.

16. The apparatus as recited in claim 1, and further comprising an interface for controlling the temperature.

17. The apparatus as recited in claim 16, wherein the interface includes a display and at least one input device.

18. The apparatus as recited in claim 1, wherein the different types of integrated circuits are associated with a plurality of different platforms.

19. The apparatus as recited in claim 18, wherein the platform-independent temperature controller controls the temperature of the plurality of different types of integrated circuits each including a different one of the plurality of different platforms.

20. The apparatus as recited in claim 18, wherein the platform-independent temperature controller controls the temperature of the plurality of different types of integrated circuits each included on a different one of the plurality of different platforms.

21. A sub-system, comprising:
a platform-independent temperature controller capable of communication with a sensor that is in communication with an integrated circuit, for controlling a temperature of the integrated circuit;
wherein the platform-independent temperature controller controls the temperature of a plurality of different types of integrated circuits;
wherein a port temperature sensor receives current directly from an integrated diode of the integrated circuit, remains in communication with the integrated diode via a port coupled to the platform-independent temperature controller, converts the current to a temperature associated with the integrated circuit, and communicates the temperature to the platform-independent temperature controller.

22. A method, comprising:
sensing a temperature of an integrated circuit; and
controlling the temperature of the integrated circuit utilizing a platform-independent temperature controller, based on the sensed temperature;
wherein the platform-independent temperature controller controls the temperature of a plurality of different types of integrated circuits;
wherein a port temperature sensor receives current directly from an integrated diode of the integrated circuit, remains in communication with the integrated diode via a port coupled to the platform-independent temperature controller, converts the current to a temperature associated with the integrated circuit, and communicates the temperature to the platform-independent temperature controller.

* * * * *